US011265006B2

(12) United States Patent
Barrenscheen et al.

(10) Patent No.: US 11,265,006 B2
(45) Date of Patent: Mar. 1, 2022

(54) USING A SAMPLING SWITCH FOR MULTIPLE EVALUATION UNITS

(71) Applicant: Infineon Technologies AG, Neubiberg (DE)

(72) Inventors: Jens Barrenscheen, Munich (DE); Peter Bogner, Wernberg (AT); Herwig Wappis, Drobollach (AT)

(73) Assignee: Infineon Technologies AG, Neubiberg (DE)

( * ) Notice: Subject to any disclaimer, the term of this patent is extended or adjusted under 35 U.S.C. 154(b) by 489 days.

(21) Appl. No.: 16/058,749

(22) Filed: Aug. 8, 2018

(65) Prior Publication Data

US 2020/0052711 A1 Feb. 13, 2020

(51) Int. Cl.
*H03M 1/00* (2006.01)
*H03M 1/12* (2006.01)

(52) U.S. Cl.
CPC ......... *H03M 1/1245* (2013.01); *H03M 1/002* (2013.01); *H03M 1/121* (2013.01)

(58) Field of Classification Search
CPC .. H03M 1/1245; H03M 1/002; H03M 1/1215; H03M 1/468; H03M 1/466; H03M 1/0682; H03M 1/12
USPC .................................. 341/122–125, 158, 159
See application file for complete search history.

(56) References Cited

U.S. PATENT DOCUMENTS

| | | | | |
|---|---|---|---|---|
| 4,742,330 A | * | 5/1988 | Doernberg | H03M 1/10 341/159 |
| 5,324,995 A | * | 6/1994 | Yee | G11C 27/024 327/76 |
| 5,416,432 A | * | 5/1995 | Lewis | G01R 19/04 327/58 |
| 6,788,240 B2 | * | 9/2004 | Reyneri | H03M 1/123 341/155 |
| 6,940,445 B2 | | 9/2005 | Kearney | |
| 7,015,729 B1 | * | 3/2006 | Tursi | G11C 27/024 327/94 |
| 8,884,801 B1 | * | 11/2014 | Ranjbar | H03M 1/002 341/156 |
| 8,902,093 B1 | | 12/2014 | Leuciuc et al. | |
| 8,902,094 B1 | * | 12/2014 | Zhang | H03M 1/08 341/122 |
| 8,907,833 B1 | | 12/2014 | Zhou et al. | |
| 9,000,962 B1 | | 4/2015 | Leuciuc | |
| 9,401,727 B1 | | 7/2016 | Mastantuono et al. | |
| 2007/0188367 A1 | * | 8/2007 | Yamada | H03M 1/123 341/155 |
| 2009/0128391 A1 | * | 5/2009 | Bailey | H03M 1/168 341/172 |
| 2010/0231428 A1 | | 9/2010 | Nakajima | |

(Continued)

*Primary Examiner* — Linh V Nguyen
(74) *Attorney, Agent, or Firm* — Shumaker & Sieffert, P.A.

(57) ABSTRACT

In some examples, an integrated circuit device includes a sampling switch configured to sample an input signal. The integrated circuit device also includes a first evaluation unit configured to receive the sampled input signal from the sampling switch and evaluate the sampled input signal. The integrated circuit device further includes a second evaluation unit configured to receive the sampled input signal from the sampling switch and evaluate the sampled input signal. The sampling switch is configured to deliver the sampled input signal to the first evaluation unit and deliver the sampled input signal to the second evaluation unit.

20 Claims, 11 Drawing Sheets

(56) References Cited

U.S. PATENT DOCUMENTS

| | | |
|---|---|---|
| 2011/0183639 A1 | 7/2011 | Morishita |
| 2012/0050082 A1* | 3/2012 | Danesh ............... H03M 1/1215 341/122 |
| 2018/0031610 A1 | 2/2018 | Bogner et al. |
| 2018/0083649 A1 | 3/2018 | Pemull et al. |

* cited by examiner

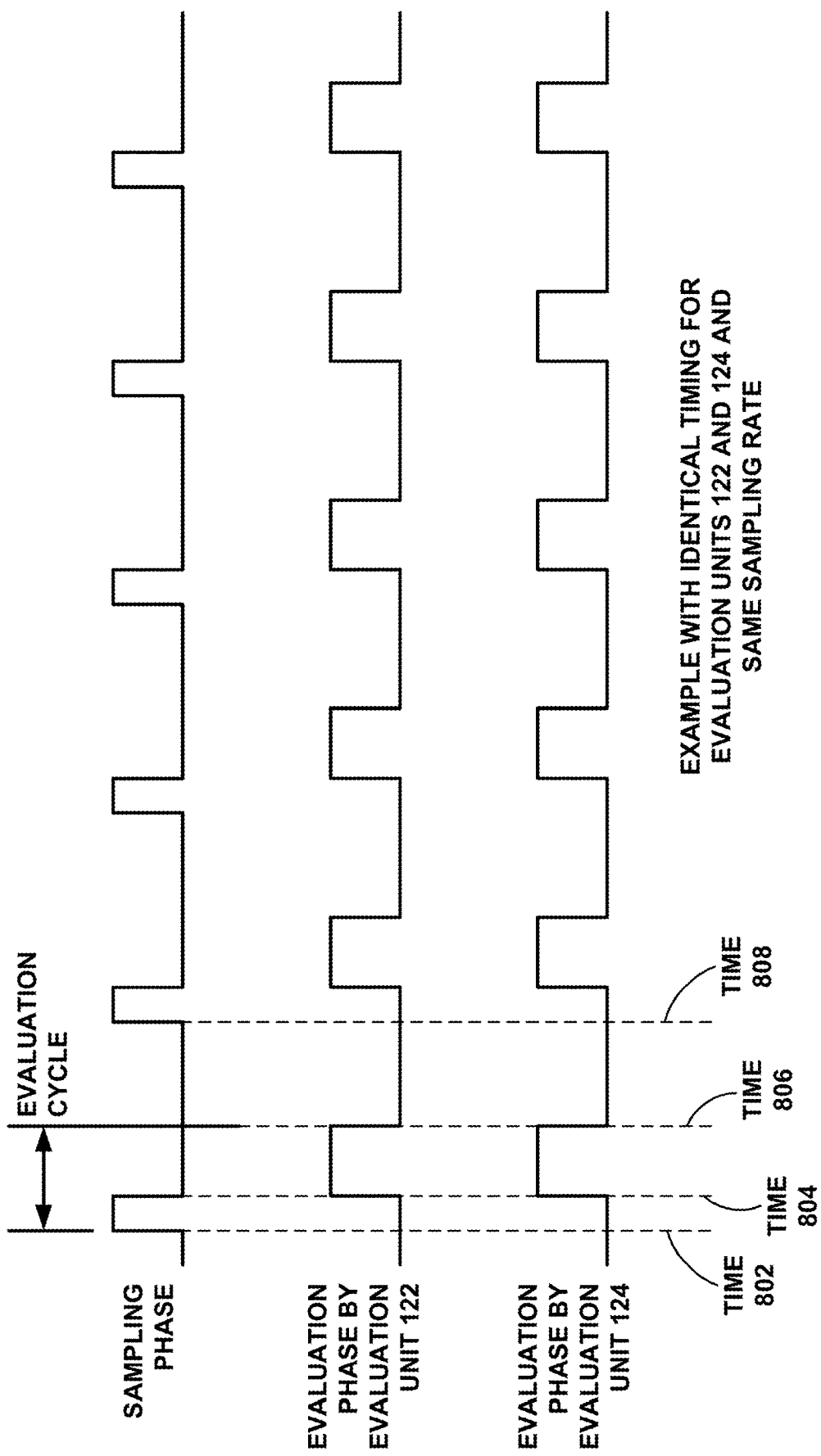

EXAMPLE WITH DIFFERENT TIMINGS FOR EVALUATION UNITS 122 AND 124, BUT WITH SAME SAMPLING RATE AND SAMPLING PHASE LENGTH

EXAMPLE WITH DIFFERENT TIMINGS FOR EVALUATION UNITS 122 AND 124, AND WITH DIFFERENT SAMPLING RATE, BUT SAME SAMPLING PHASE LENGTH

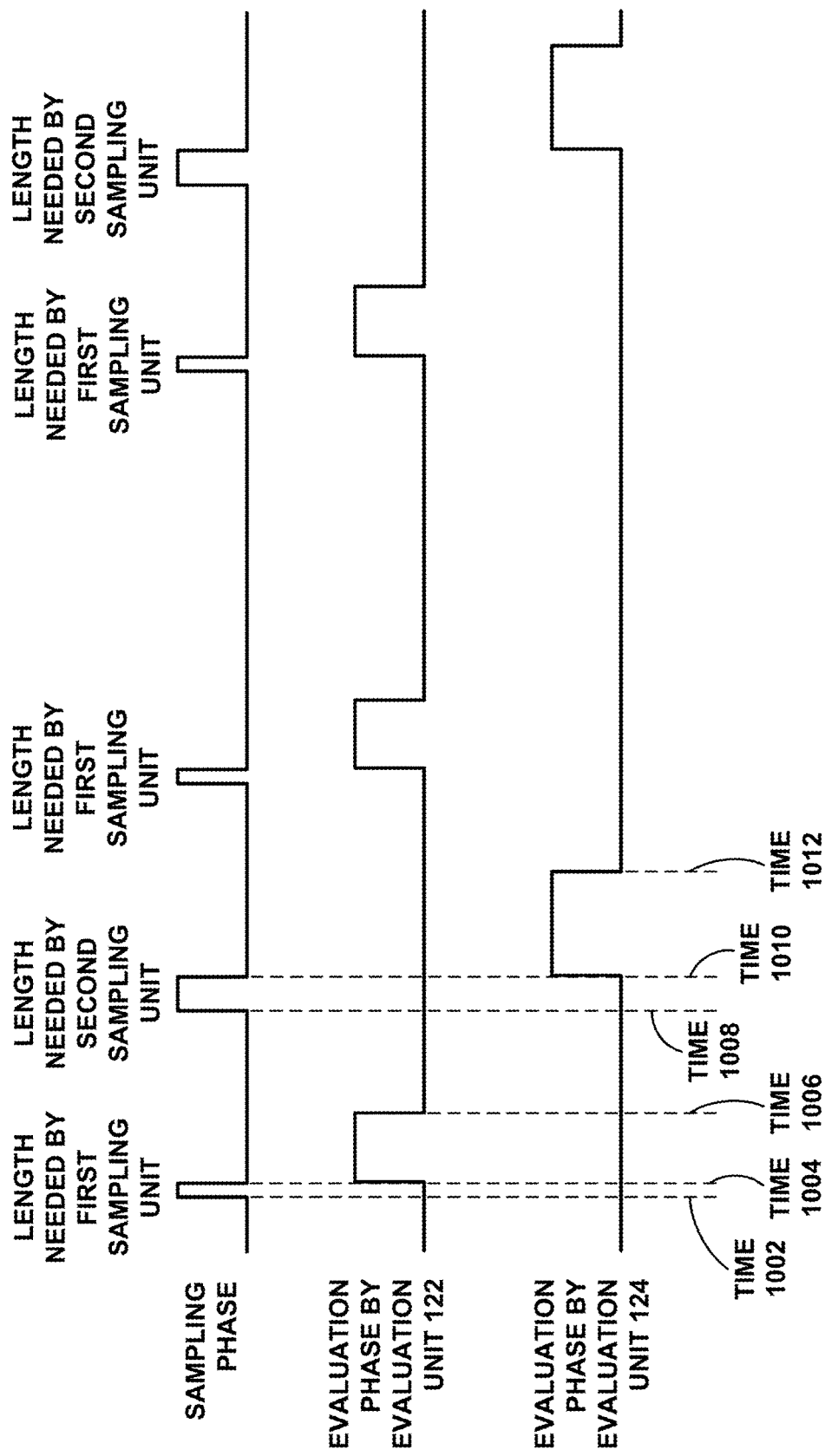

USING A SAMPLING SWITCH FOR MULTIPLE EVALUATION UNITS

TECHNICAL FIELD

This disclosure relates to circuits that include evaluation units such as current-sensing circuits, voltage-sensing circuits, and analog-to-digital converters.

BACKGROUND

A power electronics device can include a power switch that operates in a relatively high-voltage environment, where operating voltage ranges may exceed ten volts, one hundred volts, or more. The power electronics device may also include a low-voltage environment, which includes circuitry such as a microcontroller and an evaluation unit such as a current-sensing circuit or an analog-to-digital conversion circuit. The evaluation unit can check a sampled input signal against a threshold (e.g., an over-voltage threshold or an over-current threshold) and/or convert the sampled input signal to a numerical value. For example, the evaluation unit can monitor the voltage of an inductive load, a partly inductive load, or any other type of voltage.

The power electronics device can sample the signal being monitored using a sampling switch that is configured to deliver a sampled signal from the high-voltage environment to the low-voltage environment. A voltage divider circuit can translate the sampled signal to a lower voltage range in order to protect the low-voltage environment. The sampling switch, when active, can conduct electricity from a first node of the power electronics device (e.g., a high-side load terminal of the power switch) to the low-voltage environment. The power electronics device may also include an optional second sampling switch that, when active, conducts electricity from a second node of the power electronics device (e.g., a low-side load terminal of the power switch) to the low-voltage environment.

SUMMARY

This disclosure describes techniques for using a sampling switch to sample an input signal when the sampling switch is active. The sampling switch may be further configured to deliver the sampled input signal to multiple evaluation units.

In some examples, an integrated circuit device includes a sampling switch configured to sample an input signal. The integrated circuit device also includes a first evaluation unit configured to receive the sampled input signal from the sampling switch and evaluate the sampled input signal. The integrated circuit device further includes a second evaluation unit configured to receive the sampled input signal from the sampling switch and evaluate the sampled input signal. The sampling switch is configured to deliver the sampled input signal to the first evaluation unit and deliver the sampled input signal to the second evaluation unit.

A method includes controlling a first evaluation unit of an integrated circuit device to receive a sampled input signal from a sampling switch of the integrated circuit device and evaluate the sampled input signal. The method further includes controlling a second evaluation unit of the integrated circuit device to receive the sampled input signal from the sampling switch and evaluate the sampled input signal. The method also includes controlling the sampling switch at least in part by sampling the input signal, delivering the sampled input signal to the first evaluation unit, and delivering the sampled input signal to the second evaluation unit.

A device includes a sampling switch configured to sample an input signal, a first evaluation unit configured to receive the sampled input signal from the sampling switch and evaluate the sampled input signal. The device also includes a second evaluation unit configured to receive the sampled input signal from the sampling switch and evaluate the sampled input signal, wherein the first evaluation unit and the second evaluation unit are configured to share the sampling switch.

The details of one or more examples are set forth in the accompanying drawings and the description below. Other features, objects, and advantages will be apparent from the description and drawings, and from the claims.

BRIEF DESCRIPTION OF DRAWINGS

FIGS. 8-10 are timing diagrams of control signals generated by a control circuit, in accordance with some examples of this disclosure.

DETAILED DESCRIPTION

This disclosure describes devices, methods, and techniques for two or more evaluation units to share a single sampling switch. The sampling switch is configured to sample an input signal, such as a digital signal or an analog signal, such as a voltage level at a node or a voltage drop across an electrical component. The sampling switch is configured to deliver the sampled input signal to the two or more evaluation units. The two or more evaluation units are configured to share the sampling switch by receiving and evaluating the sampled input signal from the sampling switch.

Figure 1:
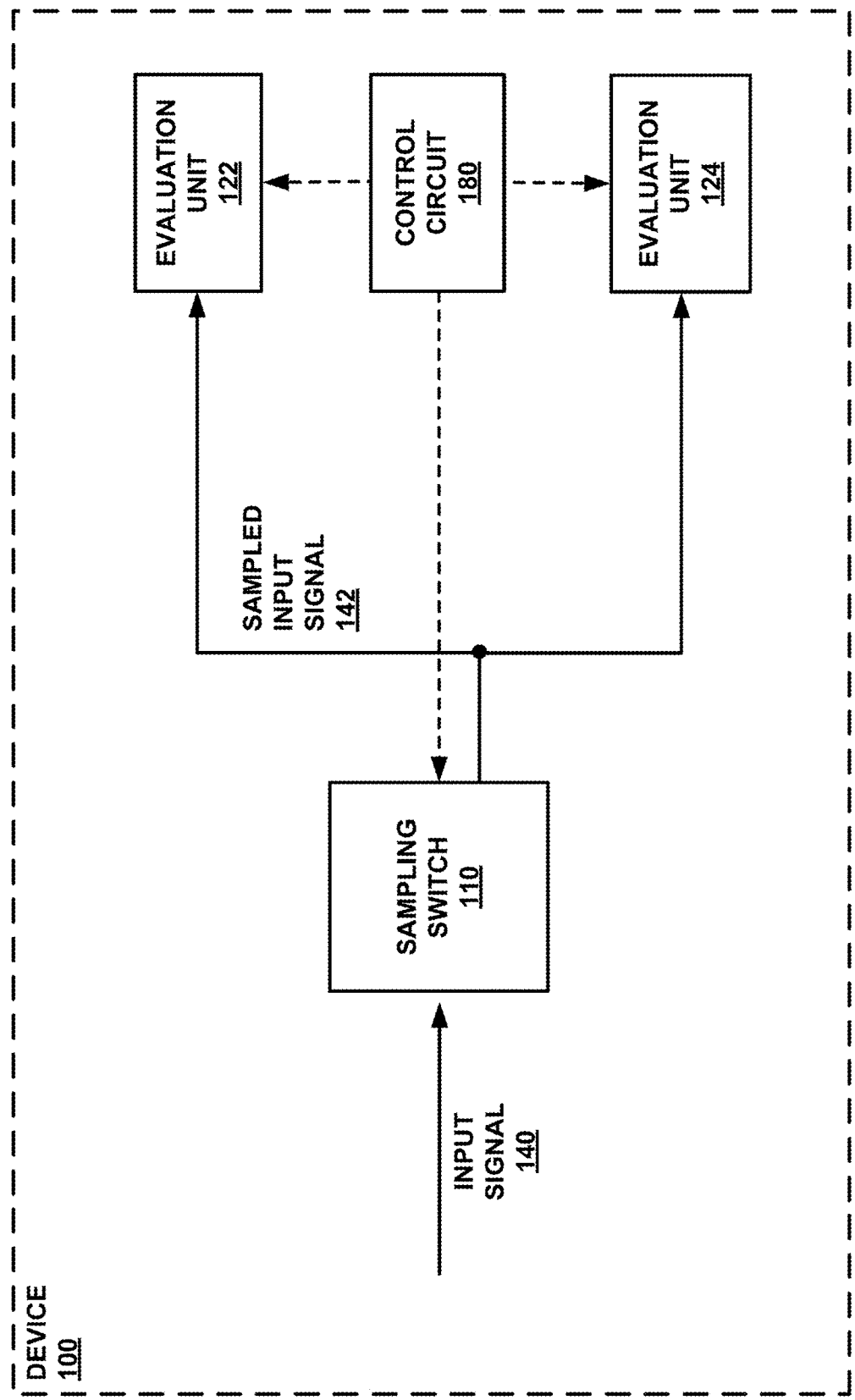
FIG. 1 is a conceptual block diagram of a device including a sampling switch and multiple evaluation units, in accordance with some examples of this disclosure.
Figure 2:
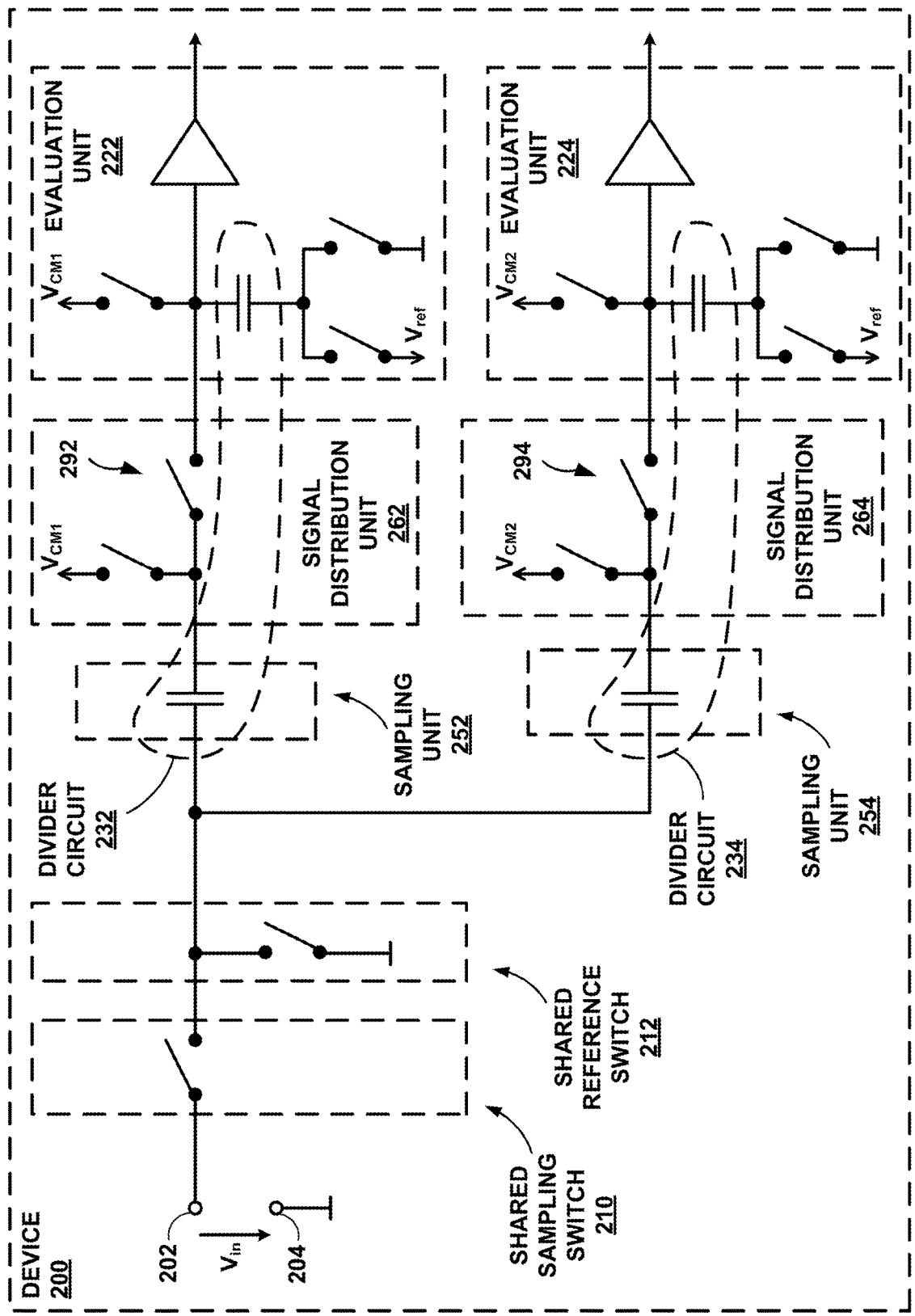
FIG. 2 is a schematic circuit diagram of a device including a sampling switch and two capacitive divider circuits, in accordance with some examples of this disclosure.
Figure 3:
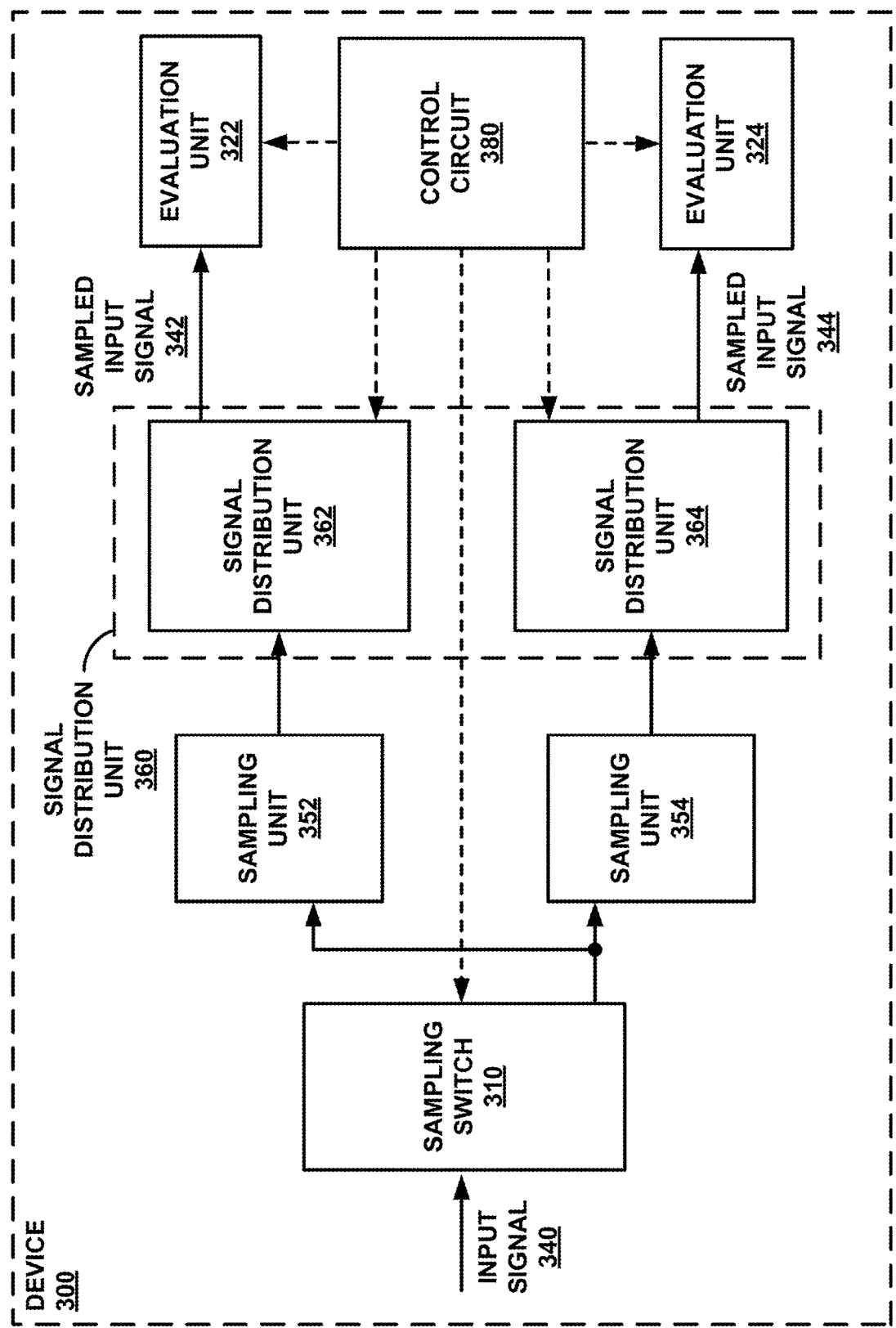
FIG. 3 is a conceptual block diagram of a device including a control circuit configured to control the operation of a sampling switch, evaluation units, and a signal distribution unit, in accordance with some examples of this disclosure.
Figure 5:
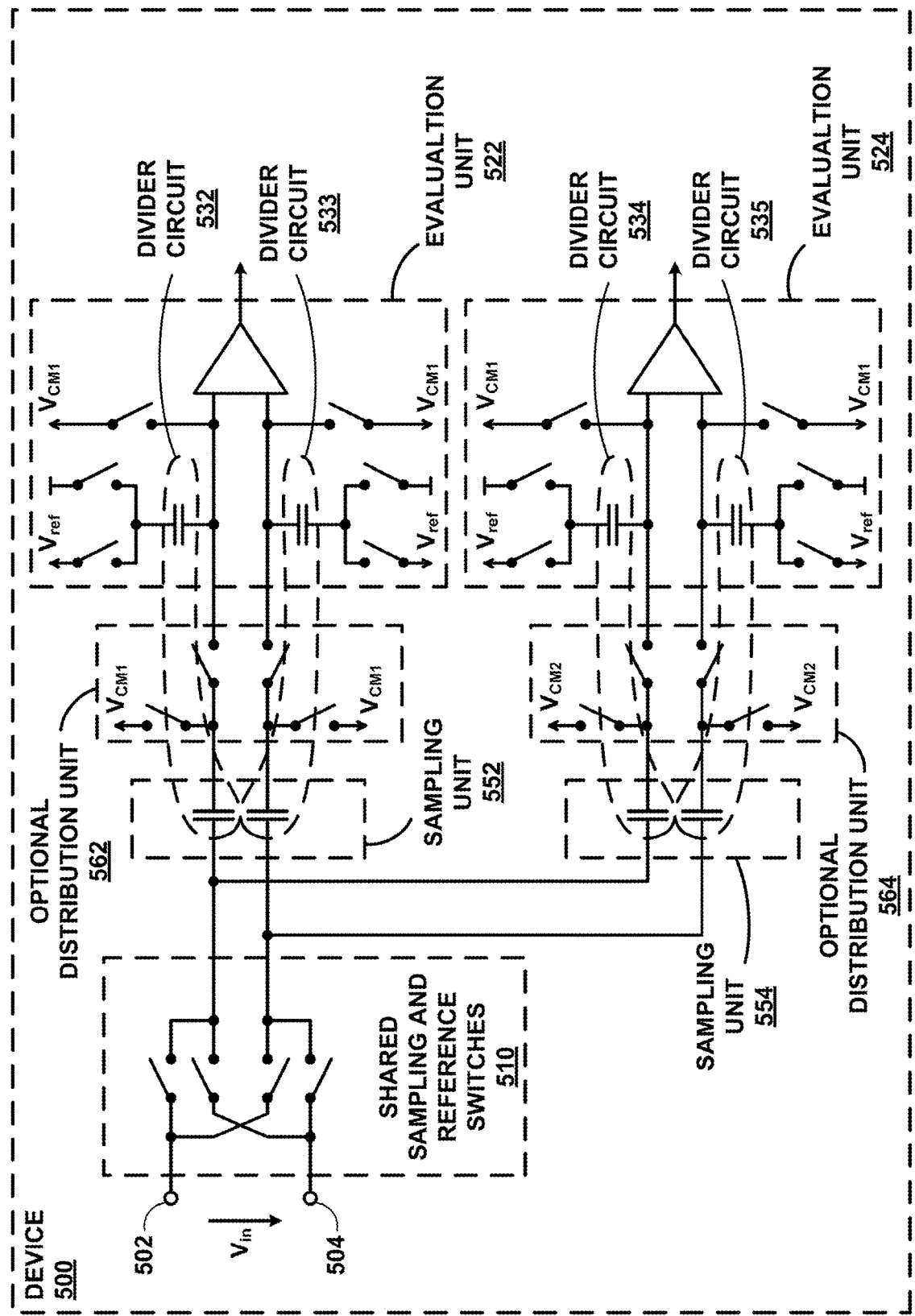
FIG. 5 is a schematic block and circuit diagram of a device including a set of sampling switches and reference switches, two sampling units, two distribution units, and two evaluation units, in accordance with some examples of this disclosure.

In single-ended implementations as shown in FIGS. 1-3, a single sampling switch may be configured to sample and deliver the input signal to the evaluation units. In differential implementations as shown in FIGS. 5 and 6, a single set of sampling switches (e.g., two or more sampling switches) may be configured to sample and deliver a differential input signal to the evaluation units. In a differential implementation, the sampled input signal may be, for example, a voltage difference between two nodes sampled by the set of sampling switches.

The input signal may be an analog signal or a digital signal, depending on the function of the evaluation units. In one example, the input signal may be an analog signal and an evaluation scheme of the evaluation units may include one of the following: SD-ADC, SAR-ADC, analog comparator, analog filter, additional sample-and-hold (S&H) unit. In another example, the input signal may be a digital signal and the evaluation scheme may include a Schmitt-Trigger input stage. Here, the sampling switch may be used to replace a level-shifter device if the digital signal does not refer to the same reference potential as the evaluation unit. For ease of understanding, the input signal will be referred to as analog signal when describing the examples in connection with FIGS. 1-11.

The techniques of this disclosure may result in improved size, cost, leakage current, and complexity for devices with two or more evaluation units. A sampling switch in a device may be designed according to the maximum voltage level of the input signal at the input of the sampling switch, which may be the maximum voltage level across the electrical component to be monitored. Especially in integrated circuits in small technology nodes such as 130 nanometers or smaller, switches for higher voltages become expensive due to their geometric size. The level-shifter from digital logic to the high-voltage domain may be even larger than the high-voltage switches.

Sampling switches can be relatively large and expensive components of electronic devices and semiconductor devices. The sampling units and/or evaluation units may be relatively small in comparison to the sampling switches. For example, a set of sampling switches may take up a large percentage, such as fifty to seventy percent, of the total area of that part of the device. By designing multiple evaluation units of a device to share one or more sampling switches, the device may have reduced semiconductor area, as compared to a device where each evaluation unit has one or more separate, dedicated sampling switches. The reduction in area due to sharing a single set of sampling switches may be a substantial amount, such as thirty to fifty percent of the area of the device.

If a device includes multiple evaluation units, a control circuit may be configured to synchronize the operation of the evaluation units (see FIGS. 8-10). The control circuit may be configured to cross-check the functionality and performance of the sampling switch (e.g., an input switch) across multiple evaluation units. For example, a synchronization scheme can trigger a fast compare action and an analog-to-digital converter (ADC) conversion. Thus, the control circuit may be configured to self-test the sampling switches and the evaluation units using the redundancy of the multiple evaluation units.

In some examples, a device includes multiple evaluation units for evaluating an input signal in different ways, depending on the operation mode of the device. For example, in one operating mode, a first evaluation unit compares the sampled input signal against a threshold to make a greater/smaller decision (e.g., an overvoltage determination). In another operating mode, a second evaluation unit converts the sampled input signal into a numerical value by using an ADC. The different evaluation schemes may be handled by different evaluation units. In one operating mode, the device can activate a first evaluation unit, whereas in another operating mode, the device may activate a second evaluation unit, while switching off the first evaluation unit. The device may include an operating mode that involves applying two or more different evaluation schemes in the same device, with identical or different timings. The device may also include different operating modes, where parts of the device may be de-activated, e.g., one evaluation unit is activated, whereas another evaluation unit is not activated. De-activating an evaluation unit that is not needed for a specific function for a given time range may reduce the power consumption of the device.

Even if each evaluation unit has its own sampling unit (e.g., a dedicated sampling unit for each evaluation unit), more than one sampling switch significantly increases the size needed for implementation of the device. Thus, using a single sampling switch or a single set of sampling switches shared by several evaluation units can reduce the size, cost, and complexity of a device. Moreover, synchronization or control of the operation of the sampling switch(es) may be simpler for a shared sampling switch or a shared set of sampling switches, as compared to separate, dedicated sampling switches.

For each figure of this disclosure, each evaluation unit may be connected to an independent, dedicated sampling unit, or multiple evaluation units may be connected to a sampling unit that is shared by the multiple evaluation units. In addition, there may be applications where concurrent operation of different evaluation schemes is needed for an input signal. For example, a fast compare action against a threshold is needed for overvoltage or overcurrent protection or plausibility checks, and in the device (and possibly concurrently), an ADC may convert the same input signal into a numerical value for voltage regulation or other measurements.

In accordance with the techniques of this disclosure, a first evaluation unit can operate in the same device as a second evaluation unit, and the two evaluation units can share the sampling switch(es). A control circuit may apply a synchronization scheme that enables the evaluation of the sampled input signals according to the specific application. For example, a data rate of five million samples per second is needed for an analog-to-digital (A/D) conversion performed by a first evaluation unit (e.g., by a sigma-delta (SD) modulator), but a reaction time of more than one microsecond may be sufficient for the compare action of a second evaluation units. The sampling and the evaluation with the SD modulator can take place with a frequency of five megahertz, but the compare action is only started every fifth sample. This synchronization scheme can reduce the overall current consumption of the two evaluation units. Another possible synchronization scheme is to perform the compare action at a frequency of five megahertz and to add a digital filter to the output of the comparator.

FIG. 1 is a conceptual block diagram of a device 100 including a sampling switch 110 and multiple evaluation units 122 and 124, in accordance with some examples of this disclosure. Device 100 includes sampling switch 110, evaluation units 122 and 124, and control circuit 180. Control circuit 180 is an optional element and is not necessary in all examples of this disclosure. For example, sampling switch 110 and evaluation units 122 and 124 may be configured to receive control signals from an external control circuit. In some examples, a sampling unit (not shown in FIG. 1) is coupled between the sampling switch 110 and the evaluation units 122, 124. In other examples, a first sampling unit (not shown in FIG. 1) is coupled between the sampling switch 110 and the evaluation unit 122 and a second sampling unit (not shown in FIG. 1) is coupled between the sampling switch 110 and the evaluation unit 124. Devices 200, 300, 400, 402, 500, 600, and 700 shown in FIGS. 2-7 are examples of device 100 with additional, optional elements.

Device 100 may be an integrated circuit device that includes elements 110, 122, 124, and 180 integrated into a single circuit. In some examples, all of elements 110, 122, 124, and 180 are implemented on the same semiconductor substrate and/or the same semiconductor die, rather than being assembled from discrete components. Devices 200, 300, 400, 402, 500, 600, and 700 shown in FIGS. 2-7 may also be integrated into a single semiconductor substrate. Having two or more evaluation units that share a single sampling switch may result in cost and area savings for device 100 because sampling switches can consume a substantial area in a semiconductor device. In addition, having two or more evaluation units that share a single sampling switch may result in a reduced leakage current consumption.

Sampling switch 110 is configured to sample input signal 140, deliver sampled input signal 142 to evaluation unit 122 and to evaluation unit 124. For ease of understanding, input signal 140 may be referred to as an analog signal 140 and the sampled input signal 142 may be referred to as a sampled analog signal when describing the example in connection with FIG. 1. However, input signal 142 may be a digital signal in some examples. Sampling switches 210, 310, 510, 610, 710, and 712 shown in FIGS. 2, 3, and 5-7 are examples of sampling switch 110. In some examples, control circuit 180 is configured to concurrently deliver sampled input signal 142 to evaluation unit 122 and to evaluation unit 124 (see FIGS. 8, 9A, and 9B). Additionally or alternatively, control circuit 180 may be configured to deliver sampled input signal 142 to evaluation unit 122 at a first time and to evaluation unit 124 at a second time, where the first time is different than the second time (see FIG. 10). Thus, an evaluation cycle for evaluation unit 122 may or may not overlap with an evaluation cycle for evaluation unit 124.

Sampling switch 110 may include one or more metal-oxide semiconductor (MOS) field-effect transistor (FET), bipolar junction transistor (BJT), and/or insulated-gate bipolar transistor (IGBT), or other types of electronic switches. Sampling switch 110 may include an n-type transistor and/or p-type transistor. In some examples, sampling switch 110 may include other analog devices such as diodes, resistors, and/or capacitors. Sampling switch 110 may include various material compounds, such as silicon, silicon carbide (SiC), gallium nitride (GaN), or any other combination of one or more semiconductor materials.

The operating voltage range of sampling switch 110 may be greater than the operating voltage range of evaluation unit 122 and/or the operating voltage range of evaluation unit 124. In some examples, sampling switch 110 may be designed to tolerate a maximum input voltage level that is higher than a maximum input voltage level that is tolerated by the evaluation unit 122 and/or the evaluation unit 124. Both evaluation units 122 and 124 may have the same operating voltage range or different operating voltage ranges.

Evaluation units 122 and 124 may include any type of evaluation unit that receives and evaluates a sampled input signal. Evaluation units 122 and 124 (as well as the evaluation units shown in later drawings) may include a comparator, or an ADC, such as a successive-approximation register SAR-ADC, or an SD-ADC. An SD ADC may contain SD modulators of any order, such as first-, second-, or third-order modulators. Each of evaluation units 122 and 124 has an evaluation scheme, such as a comparison function (e.g., overvoltage detection or overcurrent detection), or any type of ADC function, such as a SAR-ADC function, or an SD-ADC function. There are many other possible evaluation schemes for evaluation units 122 and 124, or additional functions, such as filters, integrating circuits or differentiating circuits, voltage dividers or limiters, or additional S&H circuits. In some examples, the evaluation scheme of evaluation unit 122 is different from the evaluation scheme of evaluation unit 124.

Evaluation units 122 and 124 are arranged to share sampling switch 110 such that each of evaluation units 122 and 124 receives the sampled input signal 142 from sampling switch 110. Sampling switch 110 is connected between the source of input signal 140 (e.g., a power switch or an electrical load) and each of evaluation units 122 and 124. Device 100 includes a single sampling switch for both of evaluation units 122 and 124. The evaluation unit 122 may operate independently from evaluation unit 124. The evaluation unit 122 may receive the sampled input signal 142 via a different signal path than the evaluation unit 124. An evaluation of the sampled input signal 142 by evaluation unit 122 may take place independently from an evaluation of the sampled input signal 142 by evaluation unit 124.

Input signal 140 can be the voltage drop across a switch, the voltage drop across an electrical load, the electrical current through a switch, the electrical current through a resistor, capacitor, or inductor, and/or any other input signal. Input signal 140 may also be referred to as an "analog signal." The amplitude of sampled input signal 142 received by evaluation units 122 and 124 may be based on any divider circuits and sampling units that are connected between sampling switch 110 and evaluation units 122 and 124.

Control circuit 180 is configured to control sampling switch 110 to sample input signal 140. Control circuit 180 may be configured to deliver a control signal to a control terminal (e.g., a gate terminal or a base terminal) of sampling switch 110 to cause sampling switch 110 to open and close. After activation of sampling switch 110 (e.g., sampling switch 110 is closed), evaluation units 122 and 124 can receive sampled input signal 142. Control circuits 380, 580, and 680 shown in FIGS. 3, 5, and 6 are examples of control circuit 180. Control circuit 180 may also be configured to control the evaluation phases of each of evaluation units 122 and 124.

FIG. 2 is a schematic circuit diagram of a device 200 including a sampling switch 210 and two capacitive divider circuits 232 and 234, in accordance with some examples of this disclosure. Device 200 is an example of a single-ended implementation similar to device 100 shown in FIG. 1. Device 200 includes shared sampling switch 210, shared reference switch 212, evaluation units 222 and 224, divider circuits 232 and 234, sampling units 252 and 254, and optional signal distribution units 262 and 264. While the components shown in FIG. 2 are depicted as separate blocks, the functions performed by some of these blocks may be integrated within a single block or may be implemented using two or more separate blocks in a configuration that is different from the configuration shown in FIG. 2. For example, at least parts of divider circuits 232 and 234, sampling units 252 and 254, and/or signal distribution units 262 and 264 may be part of or integrated into evaluation units 222 and 224.

In the example of FIG. 2, the voltage drop across nodes 202 and 204 represents the input voltage to be sampled by shared sampling switch 210. Device 200 has a single sampling switch 210 because node 204, shared reference switch 212, and some of the switches within evaluation units 222 and 224 are connected to the same reference potential, e.g., reference ground. When sampling switch 210 is active and reference switch 212 is inactive, sampling switch 210 delivers the sampled input signal to sampling units 252 and 254. When reference switch 212 is active, the left-hand terminals of the capacitors of sampling units 252 and 254 are connected to the reference potential, e.g., during or after the evaluation phase. The sampling capacitors of sampling units 252 and 254 may be referred to as switched capacitors.

Whether sampling units 252 and 254 and divider circuits 232 and 234 store the sampled input signal depends on the status of switches 292 and 294 of signal distribution units 262 and 264. Divider circuits 232 and 234 can divide the voltage level of the sampled input signal received from sampling switch 210 and deliver a divided signal to evaluation units 222 and 224 based on the sampled input signal. In some examples, device 200 includes a single voltage divider circuit configured to receive the sampled input signal from sampling switch 210 and deliver the divided input signal to at least one of evaluation unit 222 or 224 based on the sampled input signal.

The operating range for the input voltage for evaluation unit 222 or 224 depends on the ratio between the capacitor of sampling unit 252 or 254 and the capacitor in evaluation unit 222 or 224. These two capacitors are circled as divider circuits 232 and 234. Device 200 may have an operating mode where evaluation unit 222 evaluates an input voltage in a first operating range, whereas in a second operating mode evaluation unit 224 evaluates an input voltage in a second operating range. This scenario may occur for switch voltage measurement, where either the voltage in conduction mode of the switch or the voltage in blocking mode of the switch might be of interest. In switch voltage measurement, a switch such as a power transistor is connected between nodes 202 and 204. For example, in blocking mode, evaluation unit 222 may perform a low-resolution compare action over a wide input voltage range, whereas in conduction mode, evaluation unit 224 may perform a high-resolution A/D conversion of a small input voltage.

A control circuit (not shown in FIG. 2) can apply a synchronization scheme to balance the demands of evaluation units 222 and 224 if device 200 uses evaluation units 222 and 224 in parallel. "In parallel" can refer to overlapping evaluation phases (see FIGS. 8 and 9A) and to non-overlapping evaluation phases (see FIG. 10). FIG. 9B shows both overlapping and non-overlapping evaluation phases. Signal distribution units 262 and 264 can operate such that zero, one, or both of evaluation units 222 and 224 will receive the sampled input signals at any time. For example, the control circuit may be configured to apply a synchronization scheme to cause signal distribution units 262 and 264 to deliver sampled input signals to each of evaluation units 222 and 224 for each evaluation cycle. The synchronization scheme may include overlapping or non-overlapping sampling phases and/or overlapping or non-overlapping evaluation phases (see FIGS. 8-10). The control circuit may be configured to balance the needs of evaluation units 222 and 224 to determine when to deliver sampled input signals to each evaluation unit. For example, one of the evaluation units may receive the sampled input during each evaluation cycle if that evaluation unit has a relatively short evaluation time and a high sample rate. Switches 292 and 294 of signal distribution units 262 and 264 are just functional representations for better understanding that the sampling units can be considered as independent.

In some examples, switches 292 and 294 of signal distribution units 262 and 264 may be part of and/or integrated within evaluation units 222 and 224. For example, FIG. 2 shows three switches within each of evaluation units 222 and 224. A control circuit (not shown in FIG. 2) can control switches 292 and 294 of signal distribution units 262 and 264 and the switches of evaluation units 222 and 224 to bias and/or reset the elements of divider circuits 232 and 234. The control circuit can also control the additional switches of signal distribution units 262 and 264 to define the middle node of divider circuits 232 and 234 to another voltage level (e.g., $V_{CM1}$ or $V_{CM2}$, which represent common-mode voltages that may be different for each evaluation unit). Defining the voltage level of the middle node may be used to clear a previous sampled input signal value from evaluation unit 222 or 224. FIG. 2 shows the elements of divider circuits 232 and 234 as capacitors, but divider circuits 232 and 234 may include resistive elements and/or inductive elements in addition to, or in the alternative to, capacitors. In some examples, device 200 includes a single divider circuit that is shared by both of evaluation units 222 and 224. Device 200 can also include a single sampling unit that is shared by both of evaluation units 222 and 224. The single sampling unit could be configured to receive a sampled input signal from sampling switch 210, store the sampled input signal, and deliver the sampled input signal to at least one of evaluation unit 222 or 224, depending on the status of distribution switches 292 and 294.

In some examples, the evaluation scheme of evaluation unit 222 is different from the evaluation scheme of evaluation unit 224. For example, evaluation unit 222 may be configured to perform a fast compare function, and evaluation unit 224 may be configured to perform a full conversion of the sampled input signal. Both of evaluation units 222 and 224 share a single high voltage switch (sampling switch 210) and are connected to the input via the capacitors of sampling units 252 and 254. Each of sampling units 252 and 254 are configured to receive and hold a sampled input signal received from sampling switch 210. Other possible combinations of evaluation units 222 and 224 include an SD-ADC with a fast compare function, or an SD-ADC with SAR-ADC, etc.

Depending on the operation of optional signal distribution units 262 and 264, either or both of evaluation units 222 and 224 can receive the input voltage across nodes 202 and 204. Device 200 may include a control circuit configured to open and close switches 292 and 294 in signal distribution units 262 and 264 to deliver the sampled input signal from node 202 to evaluation unit 222 and/or evaluation unit 224. Switches 292 and 294 of signal distribution units 262 and 264 can be implemented with thin oxide logic transistors.

Distribution switch 292 is configured to electrically connect sampling switch 210 to evaluation unit 222 when distribution switch 292 is active. Distribution switch 294 is configured to electrically connect sampling switch 210 to evaluation unit 224 when distribution switch 294 is active. Device 200 can include a control circuit that opens and closes distribution switches 292 and 294 to control which of evaluation units 222 and 224 receives the sampled input signals.

FIG. 3 is a conceptual block diagram of a device 300 including a control circuit 380 configured to control the operation of a sampling switch 310, evaluation units 322 and 324 and a signal distribution unit 360, in accordance with some examples of this disclosure. Device 300 includes sampling switch 310, sampling units 352 and 354, evaluation units 322 and 324, distribution unit 360 including distribution units 362 and 364, and control circuit 380. Device 300 is an example of a single-ended implementation similar to device 100 shown in FIG. 1 and device 200 shown in FIG. 2.

FIG. 3 shows how control circuit 380 can control the operation of device 300 by delivering control signals to sampling switch 310, evaluation units 322 and 324, and signal distribution unit 360. Evaluation units 322 and 324 and signal distribution units 362 and 364 may include some or all of the circuitry shown in FIG. 2. While the components shown in FIG. 3 are depicted as separate blocks, the functions performed by some of these blocks may be integrated within a single block or may be implemented using two or more separate blocks in a configuration that is different from the configuration shown in FIG. 3. Control circuit 380 may be configured to deliver control signals to the switches of evaluation units 322 and 324 and signal distribution unit 360 to selectively deliver sampled input signals 342 and 344 to evaluation units 322 and 324 or to selectively block evaluation units 322 and 324 from receiving sampled input signals 342 and 344. Control circuit 380 may be configured to reset or clear sampled input signals 342 and/or 344, which may be stored on the one or more sampling units 352 and 354, which may be integrated in or part of evaluation unit 322 or 324 or signal distribution unit 360. For ease of understanding, input signal 340 can be referred to as an analog input signal, sampled input signal 342 can be referred to as a sampled analog input signal, and sampled input signal 344 can be referred to as a sampled analog input signal when describing the example in connection with FIG. 3.

Control circuit 380 can control the timing of a sampling phase of sampling switch 310 in accordance with a timing requirement of at least one of evaluation unit 322 or 324. During the sampling phase, control circuit 380 delivers a control signal to sampling switch 310 in order to activate the sampling switch 310 and to cause sampling switch 310 to deliver a sample of input signal 340 to evaluation unit 322 and/or 324 via signal distribution unit 360. For example, during the sampling phase, the sampling switch 310 is closed. During the sampling phase, a sampling capacitor of at least one of the sampling units 352 and 354 may be coupled to the sampled input signal 340, allowing a capacitance to charge up to the voltage value of the input signal 340. The time to load the sampling capacitor may be referred to as sampling time. Control circuit 380 can select which of evaluation units 322 and 324 receives a sample of input signal 340 by opening or closing switches in signal distribution unit 360.

Control circuit 380 can also control the timing of the evaluation phase of evaluation units 322 and the timing of the evaluation phase of evaluation unit 324. The evaluation phase follows after the sampling phase. At the beginning of an evaluation phase of evaluation unit 322, for example, control circuit 380 may activate an enable signal that is provided to evaluation unit 322. The activation of the enable signal may start the evaluation phase and the enable signal may cause evaluation unit 322 to evaluate sampled input signal 342 by comparing sampled input signal 342 to a threshold signal (e.g., an overvoltage threshold) or by converting sampled input signal 342 to a digital signal. At the end of the evaluation phase an evaluation result may be provided at an output of the evaluation unit 322. The evaluation result may also be referred to as conversion result. The time to evaluate the sampled input signal 342 by the evaluation unit 322 may be referred to as the evaluation time or conversion time. The sampling phase together with the evaluation phase may be referred to as an evaluation cycle or a conversion cycle.

Figure 4:
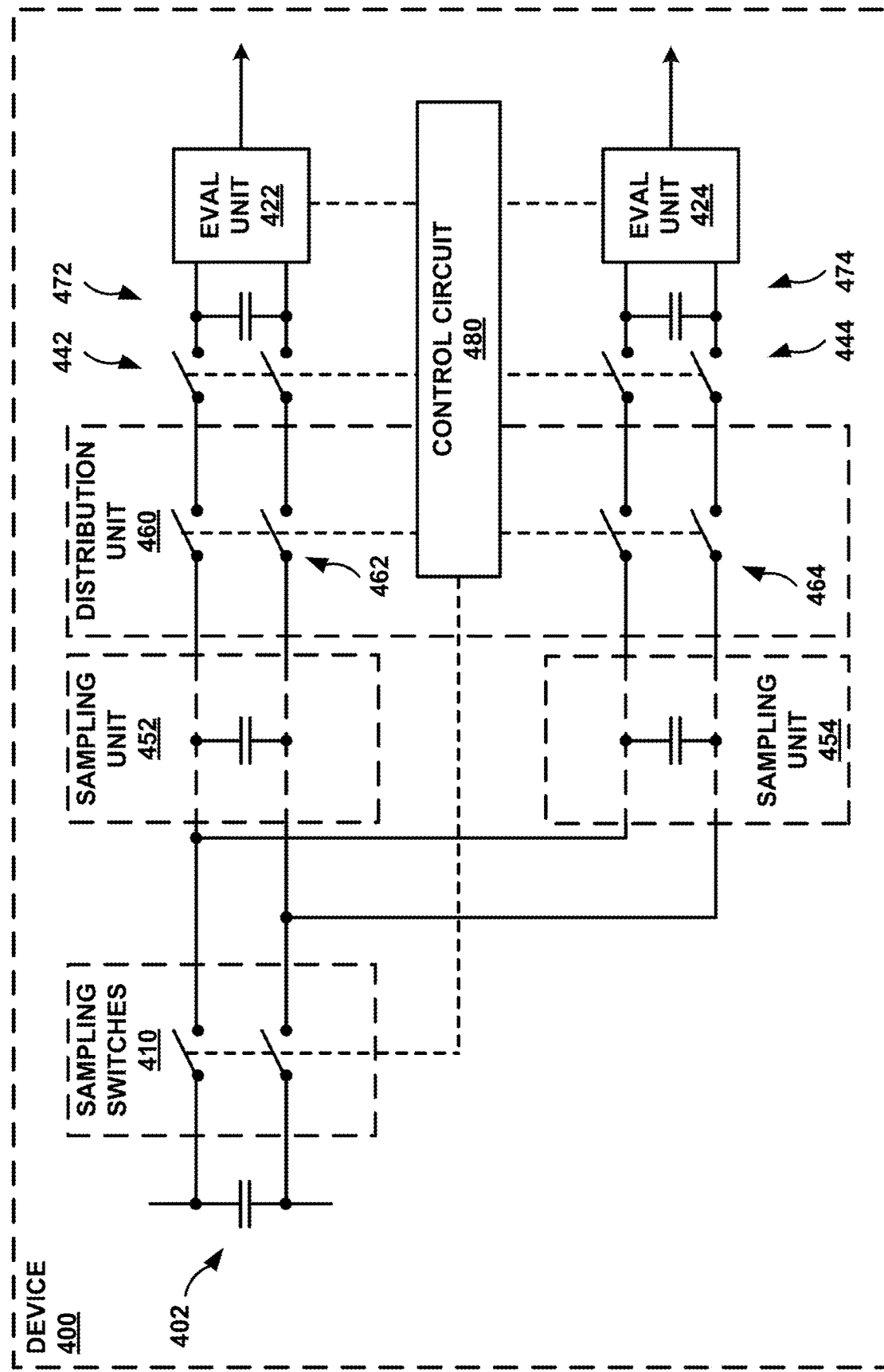
FIG. 4 is a schematic block and circuit diagram of a device including a control circuit configured to control the operation of a set of sampling switches, a signal distribution unit, and two evaluation units, in accordance with some examples of this disclosure.

FIG. 4 is a schematic block and circuit diagram of a device 400 including a control circuit 480 configured to control the operation of a set of sampling switches 410, a signal distribution unit 460, and two evaluation units 422 and 424, in accordance with some examples of this disclosure. While the components shown in FIG. 4 are depicted as separate blocks, the functions performed by some of these blocks may be integrated within a single block or may be implemented using two or more separate blocks in a configuration that is different from the configuration shown in FIG. 4. Within device 400, a differential input signal that is provided across element 402 may be evaluated by at least one of the two evaluation units 422 and 424. Control circuit 480 is configured to control the operation of the set of sampling switches 410, sets of switches 442 and 444, and signal distribution unit 460 to sample the differential input signal across element 402 and deliver the sampled input signal to one or both of evaluation units 422 and 424.

The operating voltage range of sampling switches 410 may be greater than the operating voltage range of evaluation unit 422 and/or the operating voltage range of evaluation unit 424. In an example, the sampling switch 410 may be designed to tolerate a maximum input voltage level that is higher than a maximum input voltage level that is tolerated by the evaluation unit 422 and/or the evaluation unit 424. The sampling switch 410 may be referred to as a high voltage circuit and the evaluation unit 422 and/or the evaluation unit 424 may be referred to as a low voltage circuit. For example, the operating voltage range of sampling switches 410 may be in the range of ten volts, forty volts, one hundred volts, and/or any other suitable voltage range. Both evaluation units 422 and 424 may have the same operating voltage range or different operating voltage ranges, and these voltage ranges may be two volts, three volts, five volts, and/or any other suitable voltage range. As the two evaluation units 422 and 424 share the sampling switch 410, the device 400 may have reduced area consumption as compared to a device that includes a separate sampling switch for each evaluation unit. Sampling switches 410, evaluation unit 422, and evaluation unit 424 may also have maximum operating voltages expressed in terms of a reference potential, such as a ground voltage.

The components of device 400 may be configured to scale down the input signal across element 402 to a lower voltage level for evaluation unit 422 and/or evaluation unit 424. For example, sampling units 452 and 454 and capacitors 472 and 474 may be configured to divide the input voltage using the switched-capacitor effect. The division of the sampled input signal is based on the relative capacitances of sampling units 452 and 454 and capacitors 472 and 474.

Device 400 can include an ohmic divider instead of a capacitive divider at the input of sampling unit 452 or 454. The combination of an ohmic divider and the sampling capacitor of sampling unit 452 or 454 can result in a low-pass effect that significantly reduces the bandwidth of evaluation unit 422 or 424 and increases the reaction time. In order to achieve the full bandwidth of evaluation unit 422 or 424, a capacitive divider is very useful. Moreover, resistive dividers cause direct-current electrical currents, which can introduce voltage drops in the signal sense lines and cause additional errors.

After sampling unit 452 or 454 has received the sampled input signal, control circuit 480 can disconnect sampling unit 452 or 454 from element 402 by causing set of sampling switches 410 to open or cease conducting electricity. Device 400 can reduce the original voltage level of the input signals across element 402 to a voltage level that evaluation unit 422 or 424 can easily handle in an integrated device. For example, element 402 may carry an input voltage of forty volts or more, and sampling switches 410 and sampling units 452, 454, 472, and 474 can transform this input voltage into a reduced voltage (e.g., in the range of 1.2 volts to 1.5 volts) to be handled by evaluation unit 422 or 424. The capacitor(s) in sampling units 452, 454, 472, and 474 may capacitively divide the input voltage across element 402 to a lower level. In some examples, distribution unit 460 and sampling unit 452 or 454 are integrated into evaluation unit 422 or 424. The low-voltage range used in evaluation unit 422 or 424 allows for small design (e.g., reduced area/volume) and high bandwidth. Furthermore, the common-mode capability of the measurement chain is quite high.

In this way, control circuit 480 may be configured to cause set of sampling switches 410 to sample the input signal across element 402 by closing and then opening set of sampling switches 410. To deliver the sampled input signal to evaluation unit 422 and 424, control circuit may be configured to close and then open set of switches 460. Control circuits 180 and 380 shown in FIGS. 1 and 3 may use similar techniques for sampling and delivering input signals to evaluation units 122, 124, 322, and 324.

In the example of FIG. 4, set of sampling switches 410 may take up a large percentage, such as fifty to seventy percent, of the total area of device 400. By sharing a sampling switch or a set of sampling switch across multiple evaluation units, the total area of a device can be reduced by a substantial amount, such as thirty to fifty percent.

FIG. 5 is a schematic block and circuit diagram of a device including a set of sampling switches and reference switches 510, two sampling units 552 and 554, two distribution units 562 and 564, and two evaluation units 522 and 524, in accordance with some examples of this disclosure. In the example of FIG. 5, the voltage drop across nodes 502 and 504 represents the input voltage to be sampled by shared sampling and reference switches 510. Device 500 has shared sampling and reference switches 510 for sampling the voltage drop from node 502 to node 504 or sampling the voltage drop from node 504 to node 502.

Device 500 also includes divider circuits 532-535, sampling units 552 and 554 and optional distribution units 562 and 564, which may operate in a similar manner to divider circuits 232 and 234, sampling units 252 and 254 and optional distribution units 262 and 264, respectively. For example, sampling units 552 and 554 and divider circuits 532 and 534 may be configured to store the sampled input signal depending on the status of the switches of distribution units 562 and 564. Divider circuits 532 and 534 can divide the voltage level of the sampled input signal received from sampling switch 510 and deliver a divided signal to evaluation units 522 and 524 based on the sampled input signal.

The switches shown in distribution unit 562 or 564 may be configured to define the middle node of divider circuit 532, 533, 534, or 535 to a voltage level (e.g., $V_{CM1}$ or $V_{CM2}$). The switches shown in evaluation unit 522 or 524 may be configured to define the middle node of divider circuit 532, 533, 534, or 535 to a second voltage level (e.g., $V_{CM1}$ or $V_{CM2}$). The switches shown in evaluation unit 522 or 524 may also be configured to define an end node of divider circuit 532, 533, 534, or 535 to a reference voltage level (e.g., Vref) or a ground voltage level.

Figure 6B:
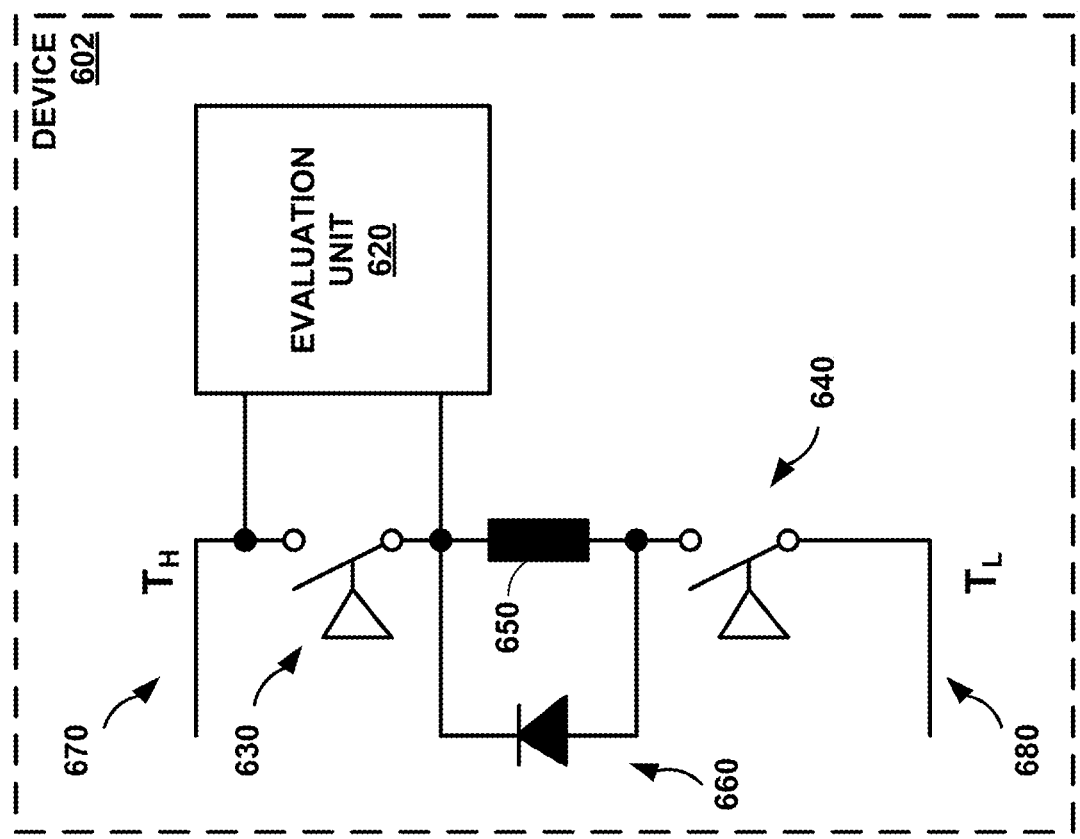
FIGS. 6A and 6B are block and circuit diagrams of devices with an evaluation unit that can be configured to monitor a voltage drop across a switch or to monitor a voltage drop across a load, in accordance with some examples of this disclosure.
Figure 6A:
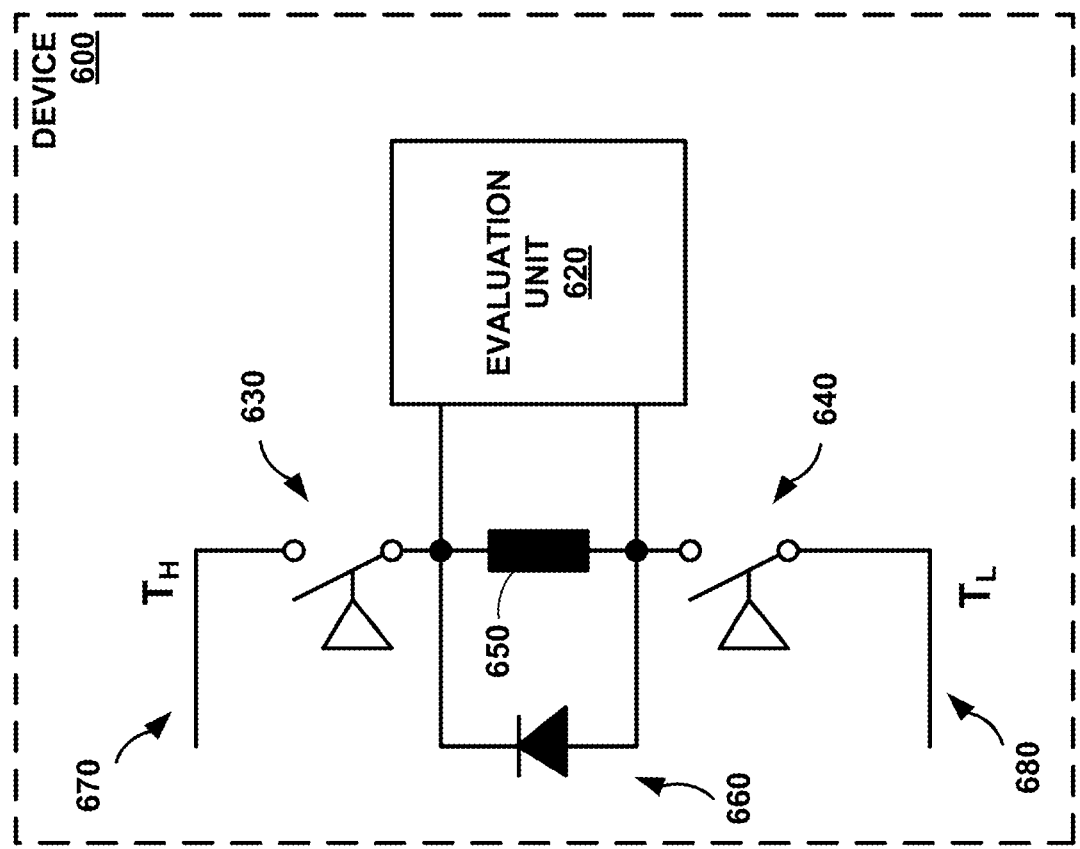

FIGS. 6A and 6B are block and circuit diagrams of devices 600 and 602 with evaluation unit 620 that can be configured to monitor a voltage drop across a switch 630 or to monitor a voltage drop across a load 650, in accordance with some examples of this disclosure. Evaluation unit 620 of device 600 is configured to monitor the voltage drop across load 650, and evaluation unit 620 of device 600 is configured to monitor the voltage drop across switch 632. Thus, evaluation unit 620 can be used to monitor a differential signal such as a load voltage drop or a switch voltage drop. In some examples, a device includes both a load voltage evaluation unit and a switch evaluation unit. One or more sampling switches may be configured to sample the voltages being monitored and to deliver the sampled voltage signals to the evaluation units.

Both of devices 600 and 602 include high-side switch 630, low-side switch 640, load 650, and freewheeling diode 660 connected in parallel with load 650. High-side switch 630 is configured to deliver electricity from high-side power supply 670 ($T_H$) to load 650. Low-side switch 640 is configured to deliver electricity from load 650 to low-side power supply 680 ($T_L$). Freewheeling diode 660 can protect load 650 from reverse voltage spikes.

Evaluation unit 620 is configured to receive and evaluate the sampled voltage signal across load 650 or the sampled voltage signal across switch 630. When switches 630 and 640 are closed, the sampled voltage signal across load 650 may be close to the difference between the voltage levels of power supplies 670 and 680. When switches 630 and 640 are open, the sampled voltage signal may be approximately the voltage drop across diode 660, which may be on the order of one volt or 0.7 volts.

Load 650 and switch 632 are examples of electrical components from which one or more sampling switches could sample an input signal and deliver the signal to evaluation unit 620. Low-side switch 640 are examples of electrical components from which one or more sampling switches could sample an input signal. FIGS. 6A and 6B show differential implementation where evaluation units receive sampled input signals from two terminals. For example, a set of sampling switches can sample a voltage difference between a first terminal of high-side switch 630 and a second terminal of high-side switch 630. The set of sampling switches may be configured to deliver the sampled voltage difference to evaluation unit 620. In some examples, a single sampling switch can sample an input signal from a single terminal, such as a node between high-side switch 630 and load 650 or a node between load 650 and low-side switch 640.

Figure 7:
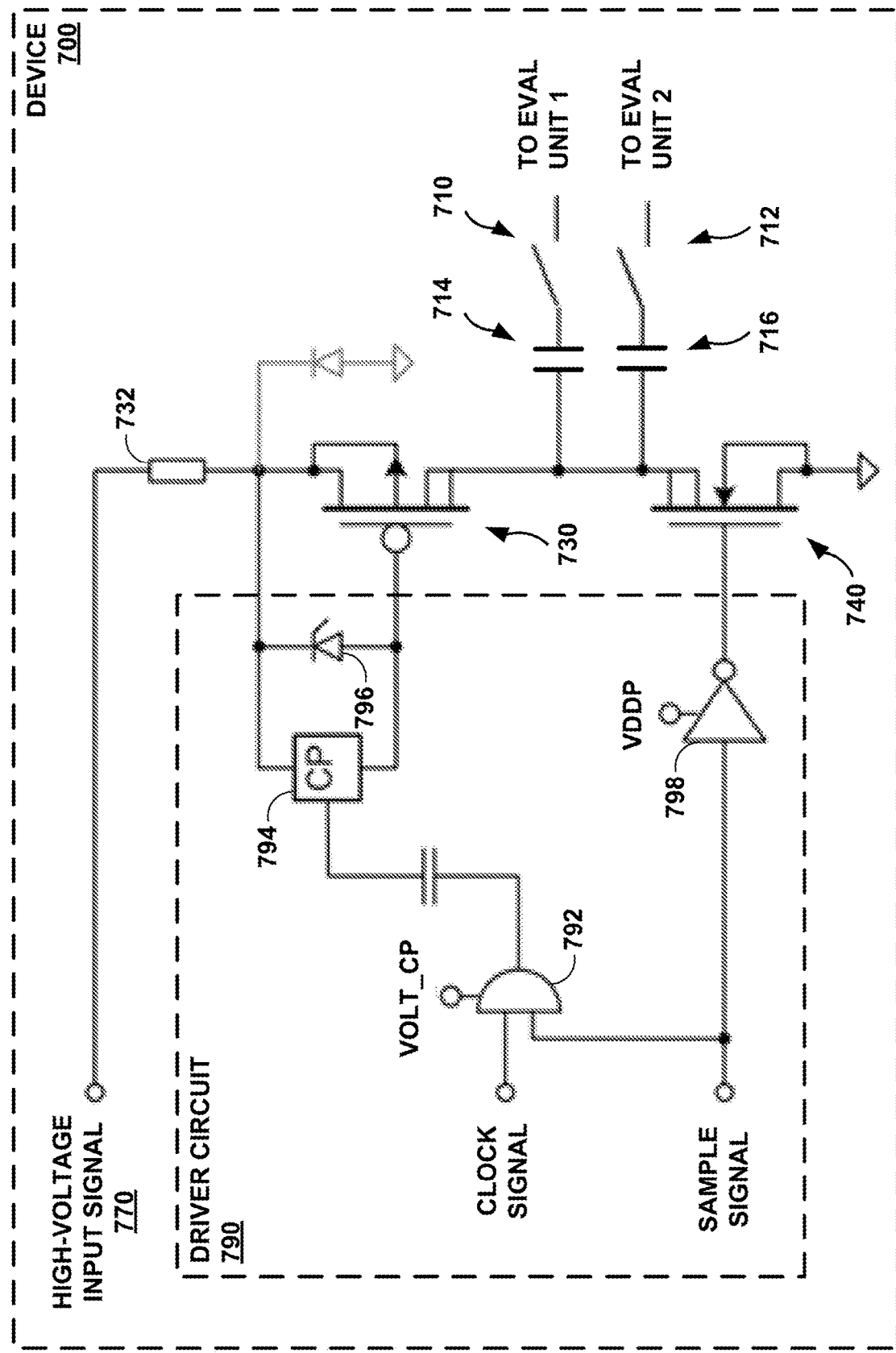
FIG. 7 is a schematic circuit diagram of a device including a high-voltage input switch with two sampling capacitors, in accordance with some examples of this disclosure.

FIG. 7 is a schematic circuit diagram of a device 700 including high-voltage input switch 730 with two sampling capacitors 714 and 716, in accordance with some examples of this disclosure. Device 700 includes sampling capacitors 714 and 716, high-voltage switches 730 and 740, and driver circuit 790.

In the example of FIG. 7, high-voltage switch 730 is a p-type laterally diffused MOSFET (PLDMOS), and high-voltage switch 740 is an n-type LDMOS (NLDMOS). In other examples, high-voltage switches 730 and 740 may include any of the following transistors: metal-oxide semiconductor (MOS) field-effect transistor (FET), bipolar junction transistor (BJT), insulated-gate bipolar transistor (IGBT) and/or junction FET (JFET). High-voltage switches 730 and 740 may include an n-type transistor and/or p-type transistor. In some examples, high-voltage switches 730 and 740 may include other analog devices such as diodes, resistors, and/or capacitors. High-voltage switches 730 and 740 may include various material compounds, such as silicon, silicon carbide (SiC), gallium nitride (GaN), or any other combination of one or more semiconductor materials.

Each of sampling capacitors 714 and 716 feeds a different evaluation unit. The right side of each of sampling capacitors 714 and 716 connects to a high-impedance node between sampling capacitors 714 and 716 and distribution switches 710 and 712. Distribution switches 710 and 712 will not bias the high-impedance node during at least the on-time phase of high-voltage switch 730. Distribution switches 710 and 712 electrically isolate the first evaluation unit from the second evaluation unit. Distribution switches 710 and 712 also electrically isolate the first high-impedance node from the second high-impedance node.

Driver circuit 790 includes logic gate 792, charge pump 794, and clamping element 796 for delivering a driver signal to high-side switch 730. Driver circuit 790 may be configured to generate a driver signal for high-side switch 730 with a voltage level that is greater than the voltage level of high-voltage input signal 770. Driver circuit 790 also includes buffer element 798 for delivering a driver signal to low-side switch 740. In some examples, driver circuit may contain greater or fewer elements than shown in FIG. 7. In some examples, the gate control of switch 730 may be built in a different way, e.g. by using other level-shifting techniques.

FIGS. 8-10 are timing diagrams of control signals generated by a control circuit, in accordance with some examples of this disclosure. The techniques of FIGS. 8-10 are described with reference to control circuit 180 and device 100 shown in FIG. 1, although other components, such as devices 200, 300, 400, 500, 600, 602, and 700 shown in FIGS. 2-7 and control circuits 380, and 480 shown in FIGS. 3 and 4, may exemplify similar techniques.

Each evaluation cycle includes two parts: the sampling phase, which comes first, and the evaluation phase, which follows the sampling phase. The length of the sampling phase may be referred to as sampling time. The sampling time may differ depending on which evaluation unit or sampling unit is used. Moreover, the length of the evaluation phase may be referred to as evaluation time. The evaluation time may differ depending on the evaluation scheme used, such as SAR-ADC, SD-ADC, comparator, and so on.

Control circuit 180 may control a timing of a sampling phase of the sampling switch 110. For example, the control circuit 180 may control the beginning and the end of the sampling phase of the sampling switch 110. During the sampling phase, control circuit 180 may be configured to deliver a control signal to sampling switch 110 between times 802 and 804 to cause sampling switch 110 to sample and deliver sampled input signal 142 to evaluation units 122 and 124. Control circuit 180 may be configured to control a timing of a sampling phase of sampling switch 110 in accordance with a timing requirement of evaluation unit 122 and/or evaluation unit 124. Control circuit 180 may be configured to determine the timing requirement for each evaluation unit based on the operating voltage range of the respective evaluation unit.

Control circuit 180 may control a timing of an evaluation phase of the first evaluation unit 122 and may control a timing of an evaluation phase of the second evaluation unit 124. For example, the control circuit 180 may control the beginning and the end of the evaluation phase of the first evaluation unit 122 and may control the beginning and the end of the evaluation phase of the second evaluation unit 124. During the evaluation phase, control circuit 180 may be configured to deliver control signals to evaluation units 122 and 124 between times 804 and 806 to cause evaluation units 122 and 124 to receive and evaluate sampled input signal 142. Between times 806 and 808, control circuit 180 is not activating control signals to sampling switch 110 or to evaluation units 122 and 124. Control circuit 180 can control the timing of the evaluation phases of evaluation units 122 and 124, as shown in FIGS. 8-10.

As shown in FIG. 8, evaluation units 122 and 124 may have evaluation phases of equal duration, equal timing, same sampling rate, and same sampling time. As another example, an evaluation unit including an ADC may need an evaluation phase with a longer duration, as compared to the duration of an evaluation phase of an evaluation unit including a threshold comparison. Thus, control circuit 180 can control the evaluation phases of evaluation units 122 and 124 to have different durations, different timings, different sampling rates, and different sampling times, as shown in FIGS. 9A, 9B, and 10.

FIG. 8 shows an example of overlapping evaluation phases for evaluation units 122 and 124, where the evaluation phase for each evaluation unit occurs between times 804 and 806. In some examples, control circuit 180 may be configured to cause the evaluation phases for evaluation units 122 and 124 to not overlap, such that the evaluation phase for evaluation unit 122 may occur between times 804 and 806 and the evaluation phase for evaluation unit 124 may occur between times 806 and 808.

Figure 9A:
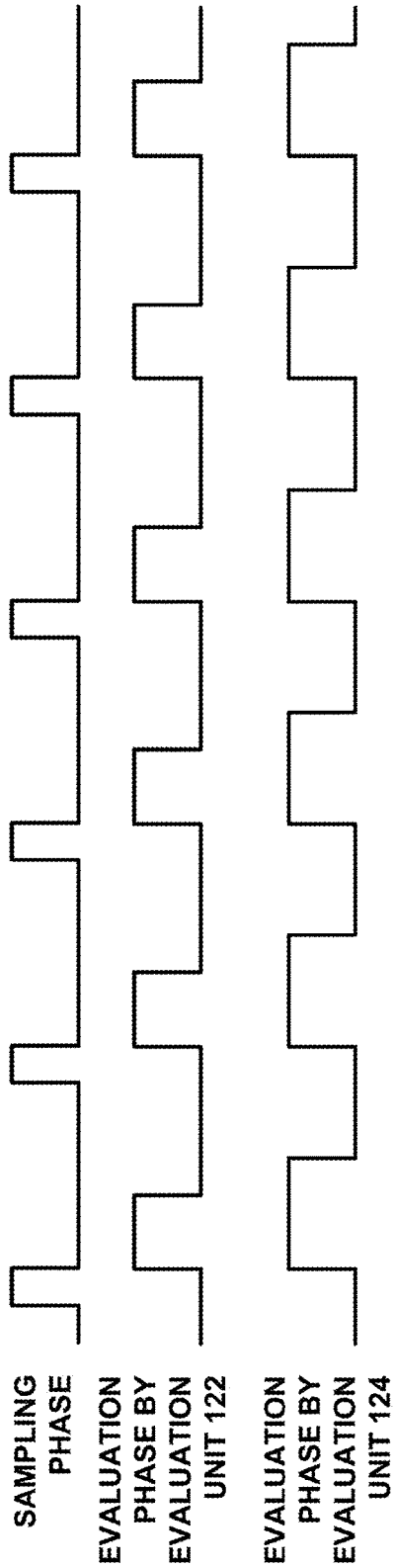
Figure 9B:
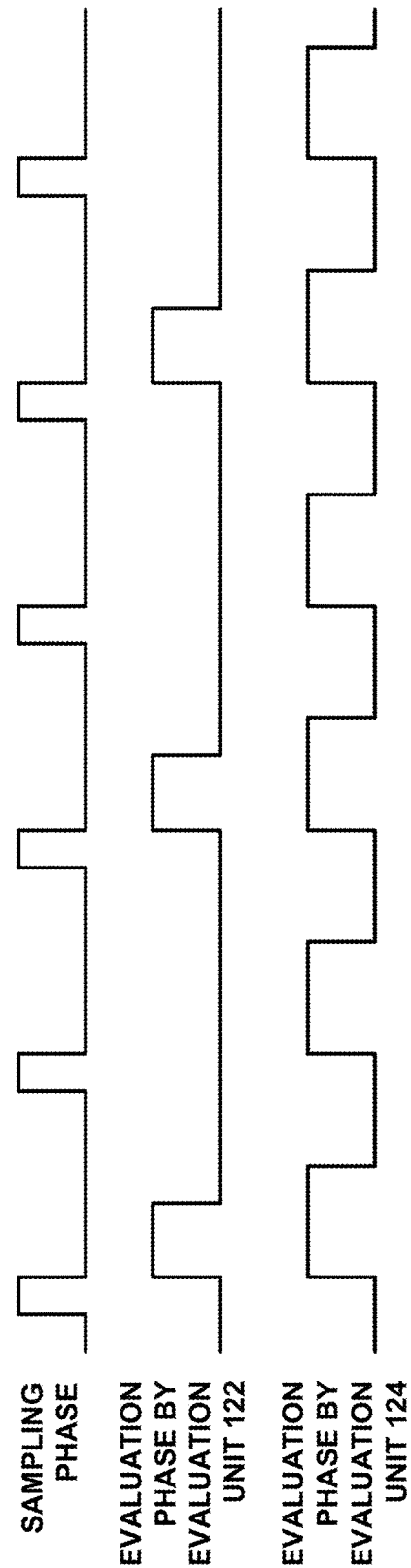

FIGS. 9A and 9B show examples of evaluation phases of different lengths and rates, and different sampling rates. In the example of FIG. 9A, control circuit 180 causes both evaluation units 122 and 124 to start the evaluation phase at the same time. However, control circuit 180 causes the evaluation unit 124 to have a longer evaluation phase than the evaluation phase for evaluation unit 122. In the example of FIG. 9A, control circuit 180 causes both of evaluation units 122 and 124 to have an evaluation phase during each evaluation cycle, i.e., the sampling rate and the sampling time of both evaluation units 122 and 124 is the same. In the example of FIG. 9B, control circuit 180 causes evaluation unit 124 to have a longer evaluation phase than evaluation unit 122, as in the example of FIG. 9A. In the example of FIG. 9B, control circuit 180 causes evaluation unit 122 to have an evaluation phase only once every two evaluation cycles of evaluation unit 124, i.e., the sampling rate of both evaluation units 122 and 124 is different, and the sampling time of both evaluation units 122 and 124 is the same. Control circuit 180 can control whether an evaluation unit has an evaluation phase within an evaluation cycle by selectively delivering control signals to the respective signal distribution unit and the respective evaluation unit.

FIG. 10 shows an example of evaluation phases of different lengths and rates, and different sampling times. In the example of FIG. 10, control circuit 180 creates a separate sampling phase for each of evaluation units 122 and 124. Control circuit 180 may control a timing of a sampling phase of the sampling switch in accordance with a timing requirement of at least one of the first evaluation unit 122 or the second evaluation unit 124. Between times 1002 and 1004, control circuit 180 delivers control signals to sampling switch 110 to cause sampling switch 110 to sample and deliver an input signal to the first sampling unit. Control circuit 180 may cause one or more distribution switches connected to evaluation unit 124 to remain inactive between times 1002 and 1004 so that the first sampling unit does not receive the sampled input signal. Between times 1004 and 1006, control circuit 180 may activate a control signal to an evaluation switch to cause the first sampling unit to deliver the sampled input signal to evaluation unit 122 for an evaluation phase. Between times 1006 and 1008, control circuit 180 does not cause a sampling phase or an evaluation phase to occur.

Between times 1008 and 1010, control circuit 180 delivers control signals to sampling switch 110 to cause sampling switch 110 to sample and deliver an input signal to the second sampling unit. Control circuit 180 may cause one or more distribution switches connected to evaluation unit 122 to remain inactive between times 1008 and 1010 so that the second sampling unit does not receive the sampled input signal. Between times 1008 and 1010, control circuit 180 may activate a control signal to an evaluation switch to cause the second sampling unit to deliver the sampled input signal to evaluation unit 124 for an evaluation phase.

The sampling phase and evaluation phase for evaluation unit 124 are longer than the sampling phase and evaluation phase for evaluation unit 122 in the example of FIG. 10. The length of the sampling phase and the length of the evaluation phase may correspond to the operating voltage range or the maximum voltage value of a respective evaluation unit. FIG. 10 shows non-overlapping evaluation phases for evaluation units 122 and 124. In some examples, control circuit 180 may be configured to cause both evaluation phases to occur at the same time.

Figure 11:
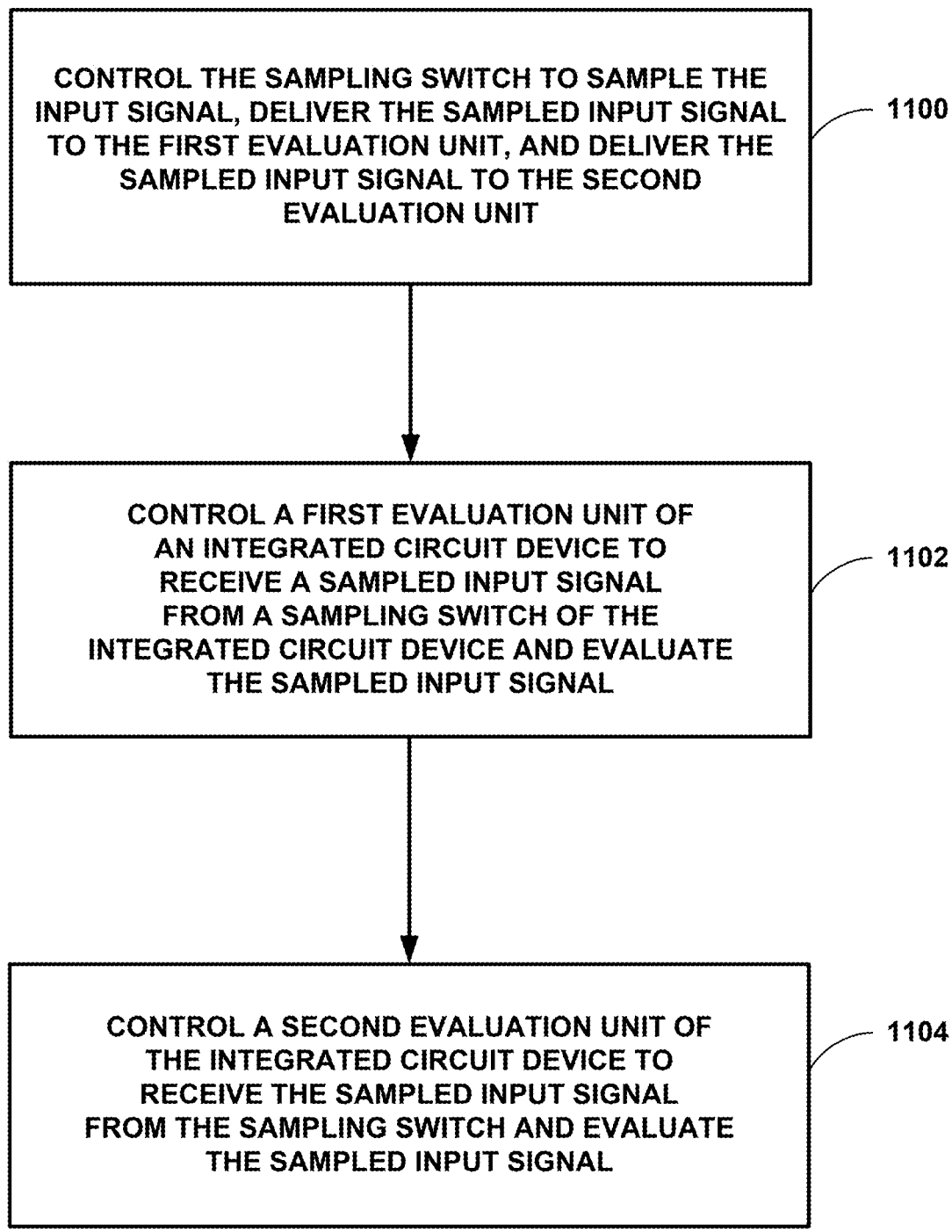
FIG. 11 is a flow diagram illustrating example techniques for using a sampling switch to deliver sampled signals to multiple evaluation units, in accordance with some examples of this disclosure.

FIG. 11 is a flowchart illustrating example techniques for using a sampling switch to deliver sampled signals to multiple evaluation units, in accordance with some examples of this disclosure. The techniques of FIG. 11 are described with reference to control circuit 180 and device 100 shown in FIG. 1, although other components, such as devices 200, 300, 400, 500, 600, 602, and 700 shown in FIGS. 2-7 and control circuits 380 and 480 shown in FIGS. 3 and 4, may exemplify similar techniques.

In the example of FIG. 11, control circuit 180 controls sampling switch 110 to sample input signal 140, deliver sampled input signal 142 to evaluation unit 122 and to deliver sampled input signal 142 to evaluation unit 124 (1100). For example, control circuit 180 may be configured to close sampling switch 110 to allow input signal 140 to flow through sampling switch 110 to evaluation units 122 and 124. In some examples, device 100 includes a sampling unit between sampling switch 110 and evaluation units 122 and 124. When control circuit 180 closes sampling switch 110, one or both of the sampling units may receive a sampled input signal. Control circuit 180 may control a signal distribution unit to control which of the sampling units receives a sample of input signal 140.

In the example of FIG. 11, control circuit 180 controls evaluation unit 122 to receive sampled input signal 142 from sampling switch 110 and evaluate the sampled input signal 142 (1102). Control circuit 180 may control an evaluation switch and/or a distribution switch to deliver sampled input signal 142 (e.g., from a sampling unit) to evaluation unit 122. Once evaluation unit 122 has received sampled input signal 142, control circuit 180 may be configured to cause evaluation unit 122 to evaluate sampled input signal 142 by, for example, converting sampled input signal 142 to a digital signal or by comparing sampled input signal 142 to a threshold level.

In the example of FIG. 11, control circuit 180 controls evaluation unit 124 to receive sampled input signal 142 from sampling switch 110 and evaluate the sampled input signal 142 (1104). Control circuit 180 may cause both of evaluation units 122 and 124 to receive sampled input signal 142 at the same time, or evaluation units 122 and 124 may have non-overlapping evaluation phases.

The following numbered examples demonstrate one or more aspects of the disclosure.

Example 1

An integrated circuit device includes a sampling switch configured to sample an input signal. The integrated circuit device also includes a first evaluation unit configured to receive the sampled input signal from the sampling switch and evaluate the sampled input signal. The integrated circuit device further includes a second evaluation unit configured to receive the sampled input signal from the sampling switch and evaluate the sampled input signal. The sampling switch is configured to deliver the sampled input signal to the first evaluation unit and deliver the sampled input signal to the second evaluation unit.

Example 2

The integrated circuit device of example 1, wherein an operating voltage range of the sampling switch is greater than an operating voltage range of at least one of the first evaluation unit or the second evaluation unit.

Example 3

The integrated circuit device of examples 1-2 or any combination thereof, wherein an operating voltage range of the first evaluation unit is different from an operating voltage range of the second evaluation unit.

Example 4

The integrated circuit device of examples 1-3 or any combination thereof, wherein an evaluation scheme of the first evaluation unit is different from an evaluation scheme of the second evaluation unit.

Example 5

The integrated circuit device of examples 1-4 or any combination thereof, further including a signal distribution unit and a control circuit configured to control the sampling switch to sample the input signal and control the signal distribution unit. The first evaluation unit is configured to receive the sampled input signal when the signal distribution unit electrically connects the sampling switch to the first evaluation unit. The second evaluation unit is configured to receive the sampled input signal when the signal distribution unit electrically connects the sampling switch to the second evaluation unit.

Example 6

The integrated circuit device of example 5, wherein the control circuit is further configured to control a timing of a sampling phase of the sampling switch in accordance with a timing requirement of at least one of the first evaluation unit or the second evaluation unit.

Example 7

The integrated circuit device of examples 5 or 6 or any combination thereof, wherein the control circuit is further configured to control a timing of an evaluation phase of the first evaluation unit and control a timing of an evaluation phase of the second evaluation unit.

Example 8

The integrated circuit device of example 7, wherein the timing of the evaluation phase of the first evaluation unit is different from the timing of the evaluation phase of the second evaluation unit.

Example 9

The integrated circuit device of examples 7 or 8 or any combination thereof, wherein the evaluation phase of the first evaluation unit does not overlap with the evaluation phase of the second evaluation unit in terms of timing.

Example 10

The integrated circuit device of examples 5-9 or any combination thereof, wherein the signal distribution unit includes a first distribution switch configured to electrically connect the sampling switch to the first evaluation unit when the first distribution switch is active. The signal distribution unit also includes a second distribution switch configured to electrically connect the sampling switch to the second evaluation unit when the second distribution switch is active.

Example 11

The integrated circuit device of examples 1-10 or any combination thereof, further including a sampling unit configured to receive the sampled input signal and deliver the sampled input signal to at least one of the first evaluation unit or the second evaluation unit.

Example 12

The integrated circuit device of examples 1-11 or any combination thereof, further including a control circuit configured to control a timing of a sampling phase of the sampling switch in accordance with a timing requirement of the sampling unit.

Example 13

The integrated circuit device of examples 1-12 or any combination thereof, further including a voltage divider circuit configured to receive the sampled input signal from the sampling switch and deliver a divided signal to at least one of the first evaluation circuit or the second evaluation unit based on the sampled input signal.

Example 14

The integrated circuit device of examples 1-13 or any combination thereof, wherein the sampling switch is configured to be coupled to a first electrical component and sample a voltage difference between a first terminal and a second terminal of the electrical component, wherein at least one of the first evaluation unit or the second evaluation unit is configured to receive the sampled voltage difference.

Example 15

A method includes controlling a first evaluation unit of an integrated circuit device to receive a sampled input signal from a sampling switch of the integrated circuit device and evaluate the sampled input signal. The method further includes controlling a second evaluation unit of the integrated circuit device to receive the sampled input signal from the sampling switch and evaluate the sampled input signal. The method also includes controlling the sampling switch at least in part by sampling the input signal, delivering the sampled input signal to the first evaluation unit, and delivering the sampled input signal to the second evaluation unit.

Example 16

The method of example 15, wherein controlling the sampling switch further comprises controlling a timing of a sampling phase of the sampling switch in accordance with a timing requirement of at least one of the first evaluation unit or the second evaluation unit.

Example 17

The method of examples 15-16 or any combination thereof, further including controlling a timing of an evaluation phase of the first evaluation unit and controlling a timing of an evaluation phase of the second evaluation unit.

Example 18

The method of examples 15-17 or any combination thereof, further including controlling a sampling unit to receive the sampled input signal and controlling the sampling unit to deliver the sampled input signal to at least one of the first evaluation unit or the second evaluation unit.

Example 19

A device includes a sampling switch configured to sample an input signal, a first evaluation unit configured to receive the sampled input signal from the sampling switch and evaluate the sampled input signal. The device also includes a second evaluation unit configured to receive the sampled input signal from the sampling switch and evaluate the sampled input signal, wherein the first evaluation unit and the second evaluation unit are configured to share the sampling switch.

Example 20

The device of example 19, wherein the sampling switch, the first evaluation unit, and the second evaluation unit are integrated in a single semiconductor substrate.

Various examples of the disclosure have been described. Any combination of the described systems, operations, or functions is contemplated. These and other examples are within the scope of the following claims.

What is claimed is:
1. An integrated circuit device comprising:
a sampling switch configured to sample an input signal;
a first evaluation unit configured to:
  receive the sampled input signal from the sampling switch; and
  evaluate the sampled input signal; and
a second evaluation unit configured to:
  receive the sampled input signal from the sampling switch; and
  evaluate the sampled input signal,
wherein the sampling switch is configured to:

deliver the sampled input signal to the first evaluation unit; and deliver the sampled input signal to the second evaluation unit, and wherein an operating voltage range of the sampling switch is greater than an operating voltage range of at least one of the first evaluation unit or the second evaluation unit such that the sampling switch is configured to receive the input signal at a first voltage level and the at least one of the first evaluation unit or the second evaluation unit is configured to receive the sampled input signal at a second voltage level, and wherein the second voltage level is lower than the first voltage level.

2. The integrated circuit device of claim 1, wherein an operating voltage range of the first evaluation unit is different from an operating voltage range of the second evaluation unit.

3. The integrated circuit device of claim 1, wherein an evaluation scheme of the first evaluation unit is different from an evaluation scheme of the second evaluation unit.

4. The integrated circuit device of claim 1, further comprising:
a signal distribution unit; and
a control circuit configured to:
control the sampling switch to sample the input signal; and
control the signal distribution unit,
wherein the first evaluation unit is configured to receive the sampled input signal when the signal distribution unit electrically connects the sampling switch to the first evaluation unit, and
wherein the second evaluation unit is configured to receive the sampled input signal when the signal distribution unit electrically connects the sampling switch to the second evaluation unit.

5. The integrated circuit device of claim 4, wherein the control circuit is further configured to control a timing of a sampling phase of the sampling switch in accordance with a timing requirement of one or more of the first evaluation unit or the second evaluation unit.

6. The integrated circuit device of claim 4, wherein the control circuit is further configured to:
control a timing of an evaluation phase of the first evaluation unit; and
control a timing of an evaluation phase of the second evaluation unit.

7. The integrated device of claim 6, wherein the timing of the evaluation phase of the first evaluation unit is different from the timing of the evaluation phase of the second evaluation unit.

8. The integrated device of claim 7, wherein the evaluation phase of the first evaluation unit does not overlap with the evaluation phase of the second evaluation unit in terms of timing.

9. The integrated circuit device of claim 4, wherein the signal distribution unit comprises:
a first distribution switch configured to electrically connect the sampling switch to the first evaluation unit when the first distribution switch is active; and
a second distribution switch configured to electrically connect the sampling switch to the second evaluation unit when the second distribution switch is active.

10. The integrated circuit device of claim 1, further comprising a sampling unit configured to:
receive the sampled input signal; and deliver the sampled input signal to one or more of the first evaluation unit or the second evaluation unit.

11. The integrated circuit device of claim 10, further comprising a control circuit configured to control a timing of a sampling phase of the sampling switch in accordance with a timing requirement of the sampling unit.

12. The integrated circuit device of claim 1, further comprising a voltage divider circuit configured to:
receive the sampled input signal at the first voltage level from the sampling switch; and
deliver a divided signal at the second voltage level to the at least one of the first evaluation circuit or the second evaluation unit based on the sampled input signal.

13. The integrated circuit device of claim 1, wherein the sampling switch is configured to:
be coupled to a first electrical component; and
sample a voltage difference between a first terminal and a second terminal of the electrical component,
wherein one or more of the first evaluation unit or the second evaluation unit is configured to receive the sampled voltage difference.

14. A method comprising:
controlling a first evaluation unit of an integrated circuit device to receive a sampled input signal from a sampling switch of the integrated circuit device and evaluate the sampled input signal;
controlling a second evaluation unit of the integrated circuit device to receive the sampled input signal from the sampling switch and evaluate the sampled input signal; and
controlling the sampling switch, wherein controlling the sampling switch comprises:
sampling the input signal;
delivering the sampled input signal to the first evaluation unit; and
delivering the sampled input signal to the second evaluation unit,
wherein an operating voltage range of the sampling switch is greater than an operating voltage range of at least one of the first evaluation unit or the second evaluation unit such that the sampling switch is configured to receive the input signal at a first voltage level and the at least one of the first evaluation unit or the second evaluation unit is configured to receive the sampled input signal at a second voltage level, and
wherein the second voltage level is lower than the first voltage level.

15. The method of claim 14, wherein controlling the sampling switch further comprises controlling a timing of a sampling phase of the sampling switch in accordance with a timing requirement of one or more of the first evaluation unit or the second evaluation unit.

16. The method of claim 14, further comprising:
controlling a timing of an evaluation phase of the first evaluation unit; and
controlling a timing of an evaluation phase of the second evaluation unit.

17. The method of claim 14, further comprising:
controlling a sampling unit to receive the sampled input signal; and
controlling the sampling unit to deliver the sampled input signal to one or more of the first evaluation unit or the second evaluation unit.

18. A device comprising:
a sampling switch configured to sample an input signal;
a first evaluation unit configured to:

receive the sampled input signal from the sampling switch; and evaluate the sampled input signal; and a second evaluation unit configured to:

receive the sampled input signal from the sampling switch; and evaluate the sampled input signal, wherein the first evaluation unit and the second evaluation unit are configured to share the sampling switch, wherein an operating voltage range of the sampling switch is greater than an operating voltage range of at least one of the first evaluation unit or the second evaluation unit such that the sampling switch is configured to receive the input signal at a first voltage level and the at least one of the first evaluation unit or the second evaluation unit is configured to receive the sampled input signal at a second voltage level, and wherein the second voltage level is lower than the first voltage level.

19. The device of claim 18, wherein the sampling switch, the first evaluation unit, and the second evaluation unit are integrated in a single semiconductor substrate.

20. The device of claim 18, wherein an operating voltage range of the first evaluation unit is different from an operating voltage range of the second evaluation unit, and wherein an evaluation scheme of the first evaluation unit is different from an evaluation scheme of the second evaluation unit.

* * * * *